US007636443B2

(12) United States Patent
Klayman

(10) Patent No.: US 7,636,443 B2
(45) Date of Patent: Dec. 22, 2009

(54) AUDIO ENHANCEMENT SYSTEM

(75) Inventor: Arnold I. Klayman, Huntington Beach, CA (US)

(73) Assignee: SRS Labs, Inc., Santa Ana, CA (US)

( * ) Notice: Subject to any disclaimer, the term of this patent is extended or adjusted under 35 U.S.C. 154(b) by 731 days.

(21) Appl. No.: 10/614,623

(22) Filed: Jul. 7, 2003

(65) Prior Publication Data

US 2004/0005063 A1 Jan. 8, 2004

Related U.S. Application Data

(63) Continuation of application No. 09/211,953, filed on Dec. 15, 1998, now Pat. No. 6,597,791, which is a continuation of application No. 08/770,045, filed on Dec. 19, 1996, now Pat. No. 5,892,830, which is a continuation of application No. 08/430,751, filed on Apr. 27, 1995, now Pat. No. 5,661,808.

(51) Int. Cl.
*H04R 5/00* (2006.01)
*H03G 5/00* (2006.01)

(52) U.S. Cl. ............................................ 381/1; 381/98

(58) Field of Classification Search ..................... 381/1, 381/17, 18, 309, 103, 66, 98
See application file for complete search history.

(56) References Cited

U.S. PATENT DOCUMENTS 3,170,991 A 2/1965 Glasgal
3,229,038 A 1/1966 Richter
3,238,304 A 3/1966 Yaita et al.
3,246,081 A 4/1966 Edwards
3,249,696 A 5/1966 Van Sickle
3,665,105 A 5/1972 Chowning
3,697,692 A 10/1972 Hafler
3,725,586 A 4/1973 Iida
3,745,254 A 7/1973 Ohta et al.
3,757,047 A 9/1973 Ito et al.

(Continued)

FOREIGN PATENT DOCUMENTS

DE 3 331 352 A1 3/1985

(Continued)

OTHER PUBLICATIONS

Eargle, J., "Multichannel Stereo Matrix Systems: An Overview", *Journal of the Audio Engineering Society*, pp. 552-558 (no date listed).

(Continued)

*Primary Examiner*—Ping Lee
(74) *Attorney, Agent, or Firm*—Knobbe Martens Olson & Bear, LLP

(57) ABSTRACT

A stereo enhancement system processes the difference signal component generated from a pair of left and right input signals to create a broadened stereo image reproduced through a pair of speakers or through a surround sound system. Processing of the difference signal component occurs through equalization characterized by amplification of the low and high range of auditory frequencies. The processed difference signal is combined with a sum signal, generated from the left and right input signals, and the original left and right input signals to create enhanced left and right output signals.

11 Claims, 4 Drawing Sheets

U.S. PATENT DOCUMENTS

| | | | |
|---|---|---|---|
| 3,761,631 A | | 9/1973 | Ito et al. |
| 3,772,479 A | | 11/1973 | Hilbert |
| 3,849,600 A | | 11/1974 | Ohshima |
| 3,860,951 A | | 1/1975 | Camras |
| 3,883,692 A | | 5/1975 | Tsurushima |
| 3,885,101 A | | 5/1975 | Ito et al. |
| 3,892,624 A | | 7/1975 | Shimada |
| 3,911,220 A | | 10/1975 | Tsurushima |
| 3,916,104 A | | 10/1975 | Anazawa et al. |
| 3,925,615 A | | 12/1975 | Nakano |
| 3,943,293 A | | 3/1976 | Bailey |
| 3,944,748 A | | 3/1976 | Kuhn |
| 3,989,897 A | | 11/1976 | Carver |
| 4,024,344 A | | 5/1977 | Dolby et al. |
| 4,027,101 A | | 5/1977 | DeFreitas et al. |
| 4,030,342 A | | 6/1977 | Bond et al. |
| 4,063,034 A | | 12/1977 | Peters |
| 4,069,394 A | | 1/1978 | Doi et al. |
| 4,085,291 A | | 4/1978 | Cooper |
| 4,087,629 A | | 5/1978 | Atoji et al. |
| 4,087,631 A | | 5/1978 | Yamada et al. |
| 4,097,689 A | | 6/1978 | Yamada et al. |
| 4,118,599 A | | 10/1978 | Iwahara et al. |
| 4,135,158 A | | 1/1979 | Parmet |
| 4,139,728 A | | 2/1979 | Haramoto et al. |
| 4,149,031 A | | 4/1979 | Cooper |
| 4,149,036 A | | 4/1979 | Okamoto et al. |
| 4,152,542 A | | 5/1979 | Cooper |
| 4,162,457 A | | 7/1979 | Grodinsky |
| 4,185,239 A | | 1/1980 | Filoux |
| 4,188,504 A | | 2/1980 | Kasuga et al. |
| 4,192,969 A | | 3/1980 | Iwahara |
| 4,204,092 A | | 5/1980 | Bruney |
| 4,208,546 A | | 6/1980 | Laupman |
| 4,209,665 A | | 6/1980 | Iwahara |
| 4,214,267 A | | 7/1980 | Roese |
| 4,218,585 A | | 8/1980 | Carver |
| 4,219,696 A | | 8/1980 | Kogure et al. |
| 4,237,343 A | | 12/1980 | Kurtin et al. |
| 4,239,937 A | | 12/1980 | Kampmann |
| 4,239,939 A | | 12/1980 | Griffis |
| 4,251,688 A | | 2/1981 | Furner |
| 4,268,915 A | | 5/1981 | Parmet |
| 4,303,800 A | | 12/1981 | DeFreitas |
| 4,308,423 A | | 12/1981 | Cohen |
| 4,308,424 A | | 12/1981 | Bice, Jr |
| 4,308,426 A | | 12/1981 | Kikuchi |
| 4,309,570 A | | 1/1982 | Carver |
| 4,316,058 A | | 2/1982 | Christensen |
| 4,329,544 A | | 5/1982 | Yamada |
| 4,332,979 A | | 6/1982 | Fischer |
| 4,334,740 A | | 6/1982 | Wray |
| 4,349,698 A | | 9/1982 | Iwahara |
| 4,352,953 A | | 10/1982 | Emmer |
| 4,355,203 A | | 10/1982 | Cohen |
| 4,356,349 A | | 10/1982 | Robinson |
| 4,388,494 A | | 6/1983 | Schone et al. |
| 4,393,270 A | | 7/1983 | Van den Berg |
| 4,394,536 A | | 7/1983 | Shima et al. |
| 4,394,537 A | | 7/1983 | Shima et al. |
| 4,408,095 A | | 10/1983 | Ariga et al. |
| 4,446,488 A | | 5/1984 | Suzuki |
| 4,479,235 A | | 10/1984 | Griffis |
| 4,489,432 A | | 12/1984 | Polk |
| 4,495,637 A | | 1/1985 | Bruney |
| 4,497,064 A | | 1/1985 | Polk |
| 4,503,554 A | | 3/1985 | Davis |
| 4,546,389 A | | 10/1985 | Gibson et al. |
| 4,549,228 A | | 10/1985 | Dieterich |
| 4,551,770 A | | 11/1985 | Palmer et al. |
| 4,553,176 A | | 11/1985 | Mendrala |
| 4,562,487 A | | 12/1985 | Hurst et al. |
| 4,567,607 A | | 1/1986 | Bruney et al. |
| 4,569,074 A | | 2/1986 | Polk |
| 4,589,129 A | | 5/1986 | Blackmer et al. |
| 4,594,610 A | | 6/1986 | Patel |
| 4,594,730 A | | 6/1986 | Rosen |
| 4,599,611 A | | 7/1986 | Bowker et al. |
| 4,683,496 A | | 7/1987 | Tom |
| 4,748,669 A | | 5/1988 | Klayman |
| 4,856,064 A | | 8/1989 | Iwamatsu |
| 4,866,774 A | | 9/1989 | Klayman |
| 4,893,342 A | | 1/1990 | Cooper |
| 4,953,213 A | | 8/1990 | Tasaki et al. |
| 5,046,097 A | | 9/1991 | Lowe et al. |
| 5,105,462 A | | 4/1992 | Lowe et al. |
| 5,208,860 A | | 5/1993 | Lowe et al. |
| 5,251,260 A | | 10/1993 | Gates |
| 5,255,326 A | | 10/1993 | Stevenson |
| 5,319,713 A | | 6/1994 | Waller, Jr. et al. |
| 5,400,405 A | | 3/1995 | Petroff |
| 5,412,731 A | * | 5/1995 | Desper ........................ 381/63 |
| 5,533,129 A | | 7/1996 | Gefvert |
| 5,661,808 A | | 8/1997 | Klayman |
| 5,692,050 A | | 11/1997 | Hawks |
| 5,832,438 A | * | 11/1998 | Bauer .......................... 381/98 |
| 5,850,454 A | | 12/1998 | Hawks |

FOREIGN PATENT DOCUMENTS

| | | | |
|---|---|---|---|
| EP | 0 097 982 | A3 | 6/1983 |
| EP | 0 320 270 | A2 | 12/1988 |
| EP | 0 312 406 | A2 | 4/1989 |
| EP | 0 354 517 | A2 | 8/1989 |
| EP | 0 526 880 | A2 | 2/1993 |
| EP | 0 637 191 | A2 | 2/1995 |
| EP | 0 699 012 | A2 | 2/1996 |
| FI | 35 014 | | 5/1965 |
| GB | 2 154 835 | | 9/1985 |
| GB | 2 277 855 | A | 11/1994 |
| JP | 40-29936 | | 10/1940 |
| JP | 43-12585 | | 5/1943 |
| JP | 50-004152 | | 12/1974 |
| JP | 55-49009 | | 4/1980 |
| JP | 58-144989 | | 9/1983 |
| JP | 61-166696 | | 2/1986 |
| JP | 63-502945 | | 10/1988 |
| WO | WO 8700609 | A1 | 10/1987 |
| WO | WO 91/19407 | | 12/1991 |

OTHER PUBLICATIONS

Stevens, S., et al., "Chapter 5: The Two-Earned Man", *Sound And Hearing*, pp. 98-106 and 196, 1965.

Vaughan, D., "How We Hear Direction", *Audio*, pp. 51-55, Dec. 1983.

Allison, R., "The Loudspeaker / Living Room System", *Audio*, pp. 18-22, Nov. 1971.

Sundberg, J., "The Acoustics of the Singing Voice", *The Physics of Music*, pp. 16-23, 1978.

Ishihara, M., "A New Analog Signal Processor For A Stereo Enhancement System", *IEEE Transactions on Consumer Electronics*, vol. 37, No. 4, pp. 806-813, Nov. 1991.

Kurozumi, K., et al., "A New Sound Image Broadening Control System Using a Correlation Coefficient Variation Method", *Electronics and Communications in Japan*, vol. 67-A, No. 3, pp. 204-211, Mar. 1984.

Schroeder, M.R., "An Artificial Stereophonic Effect Obtained from a Single Audio Signal", *Journal of the Audio Engineering Society*, vol. 6, No. 2, pp. 74-79, Apr. 1958.

Kaufman, "Frequency Contouring For Image Enhancement," *AUDIO*, pp. 34-39, Feb. 1985.

Gilman, "Some Factors Affecting the Performance of Airline Entertainment Headsets", J. Audio Eng. Soc., vol. 31, No. 12, Dec. 1983.

Stock, "The New Featherweight Headphones", Audio, pp. 30-32, May 1981.

* cited by examiner

AUDIO ENHANCEMENT SYSTEM

This application is a continuation of prior application Ser. No. 09/211,953, filed Dec. 15, 1998 now U.S. Pat. No. 6,597,791; which was a continuation of U.S. application Ser. No. 08/770,045, filed Dec. 19, 1996, now U.S. Pat. No. 5,892,830, issued Apr. 6, 1999; which was a continuation of U.S. application Ser. No. 08/430,751, filed Apr. 27, 1995, now U.S. Pat. No. 5,661,808, issued Aug. 26, 1997.

FIELD OF THE INVENTION

This invention relates generally to audio enhancement systems, and especially those systems and methods designed to improve the realism of stereo sound reproduction. More particularly, this invention relates to apparatus for broadening the sound image created from amplification of stereo signals through a pair of loudspeakers, without introducing unnatural phase-shift or time-delays within the stereo signals.

BACKGROUND OF THE INVENTION

Those actively involved in audio or audio-visual industries have continually strived to overcome the imperfections of reproduced sound. Presently, with the onslaught of interactive multimedia computer systems, and other audio-visual advances, the concern over audio quality has heightened. Consequently, there are renewed efforts among the audio industry to develop technological improvements in sound recordings and their reproduction.

Imperfections of reproduced sound can result from, among other things, microphones which ineffectively record sound, and speakers which ineffectively reproduce recorded sound. Attempts at sound image enhancement by those in the relevant industries have resulted in methods which record and encode the positional information of a sound's origin along with the sound information itself. Such methods include the multi-channel surround systems which operate using specially encoded audio information, and special decoding systems to interpret the information.

Sound enhancement systems which do not require specially recorded sound are typically less complex and much less expensive. Such systems include those which introduce unnatural time-delays or phase-shifts between left and right signal sources. Many of these systems attempt to compensate for the inability of a microphone to mimic the frequency response of a human ear. These systems may also attempt to compensate for the fact that, because of the location of a speaker, the perceived direction of sound emanating from that speaker may be inconsistent with the original location of the sound. Although the foregoing systems attempt to reproduce sound in a more realistic and life-like manner, use of such methods have resulted in mixed results in the competitive audio enhancement field.

Other sound enhancement techniques operate on what are termed sum and difference signals. The sum and difference signals represent the sum of left and right stereo signals, and the difference between left and right stereo signals, respectively.

It is known that boosting the level of difference signal in a pair of stereo left and right signals can widen a perceived sound image projected from a pair of loudspeakers, or other electroacoustic transducers, placed in front of a listener. The widened sound image results from amplification of ambient or reverberant sounds which are present in the difference signal. This ambient sound is readily perceived in a live sound stage at the appropriate level. In a recorded performance, however, the ambient sounds are masked by the direct sounds, and are not perceived at the same level as a live performance.

There have been many attempts to improve ambient sound information from a recorded performance by indiscriminately increasing the difference signal over a broad frequency spectrum. An indiscriminate increase in the difference signal, however, can undesirably affect a person's sound perception. For example, boosting of the difference signal in the mid-range of audio frequencies can lead to sound perception which is overly sensitive to the position of a listener's head.

A critically-acclaimed sound enhancement technique which processes the sum and difference signals is disclosed in U.S. Pat. Nos. 4,748,669 and 4,866,774 both issued to Arnold Klayman, the same inventor for the invention disclosed in the present application.

As disclosed in both the '669 and the '774 patents, a sound enhancement system provides either dynamic or fixed equalization of the difference signal in selected frequency bands. In such a system, equalization of the difference signal is provided to boost the difference signal components of lower intensity without overemphasizing the stronger difference signal components. The stronger difference signal components are typically found in a mid-range of frequencies of approximately 1 to 4 Khz. These same mid-range of frequencies correspond to those which the human ear has heightened sensitivity. The various embodiments of the systems disclosed in the '669 and '774 patents also equalize the relative amplitudes of the sum signal in specific frequency bands to prevent the sum signal from being overwhelmed by the difference signal. Moreover, the level of difference-signal boost provided by the '669 and '774 enhancement systems is a function of the sum signal itself.

The specific advantages of selectively boosting the sum and difference signals in light of the human auditory response characteristics, is fully disclosed in detail in U.S. Pat. No. 4,748,669 and U.S. Pat. No. 4,866,774.

Even with the foregoing audio enhancement techniques, there is a need for an audio enhancement system that can provide high quality stereo image enhancement and which can meet all of the demands of the burgeoning computer multimedia market, and those of the audio and audio-visual markets in general. The stereo enhancement system disclosed herein fulfills this need.

SUMMARY OF THE INVENTION

The apparatus and method disclosed herein for creating a wider sound image is an improvement over the related stereo enhancement systems disclosed in U.S. Pat. Nos. 4,738,669 and 4,866,744, both of which are incorporated by reference as though fully set forth herein. This improved system has already achieved wide critical acclaim. For example, in the November 1994 issue of Multimedia World, one author describes the present invention as something which "looks like it's going to be the next big thing on the multimedia PC, and for good reason: It works." Moreover, with respect to the same stereo enhancement system, the September 1994 issue of PC Gamer magazine writes: "Of all the various advances in audio technology over the past couple of years, none is as impressive."

The explosion of the computer multimedia market has created a huge class of audio and/or audio-visual systems which are ideally configured for a stereo enhancement system that can broaden a sound field emanating from two speakers. For example, most computer implementations of sound enhancement systems require simplistic circuits which are very inexpensive and which occupy very little space.

Sound generated on multimedia computer systems is typically retrieved as digital information stored on a CD-ROM, or on some other digital storage medium. Unlike analog sound-storage media, digital sound information, and in particular stereo information, is more accurately stored across a broader frequency spectrum. The presence of this information can have a significant impact on methods of stereo enhancement. In addition, amplification or enhancement of such digitally-stored sound may tend to overdrive computer audio amplifiers or computer speakers, which may be relatively "low-power" devices. This concern is particularly relevant in the lower, i.e., bass, frequencies where over-amplification can cause amplifier "clipping," and may severely damage the low-power speakers of computer systems or television sets.

Accordingly, a stereo enhancement system is disclosed which produces a realistic stereo image projected across a larger listening area. The resulting stereo enhancement is particularly effective when applied to a pair of speakers placed in front of a listener. However, the enhancement system disclosed herein may also be used with any of the current surround-sound type systems to help broaden the overall sound image and remove identifiable point sources.

Creating an award-winning stereo sound image which envelopes the listener is accomplished through a surprisingly simplistic circuit structure. In a preferred embodiment, the stereo enhancement system comprises a circuit for generating a set of sum and difference signals from left and right input source signals. The amplitude levels of the generated sum and difference signals may be fixed at a predetermined level or they may be manually adjusted by an operator of the stereo enhancement system. In addition, the left and right input source signals may be actual or synthetically generated stereo signals.

Passive component circuitry is used to spectrally shape, or equalize, the difference signal to enhance the frequency components which are statistically of low-intensity. Equalization of the low-intensity difference signal components occurs without inappropriately boosting the corresponding mid-range frequency components. In sound systems which may be unable to accommodate excessive difference-signal gain among the bass frequencies, a high-pass filter limits the amplification of these frequency components.

Shaping of the difference signal enhances any ambient or reverberant sound effects which may be present in the difference signal but masked by more intense direct-field sounds. The equalized difference signal is recombined with the sum signal and the left and right input signals, respectively, to generate enhanced left and right output signals.

The enhancement system disclosed herein may be readily implemented by a digital signal processor, with discrete circuit components, or as a hybrid circuit structure. Because of its unique circuit structure and accommodation of low-power audio devices, the enhancement system is particularly desirable in audio systems which are inexpensive, those which operate with relatively low-power output signals, and those which have limited space for incorporating an enhancement system.

BRIEF DESCRIPTION OF THE DRAWINGS

The above and other aspects, features, and advantages of the present invention will be more apparent from the following particular description thereof presented in conjunction with the following drawings, wherein.

DETAILED DESCRIPTION OF THE PREFERRED EMBODIMENT

Figure 1:
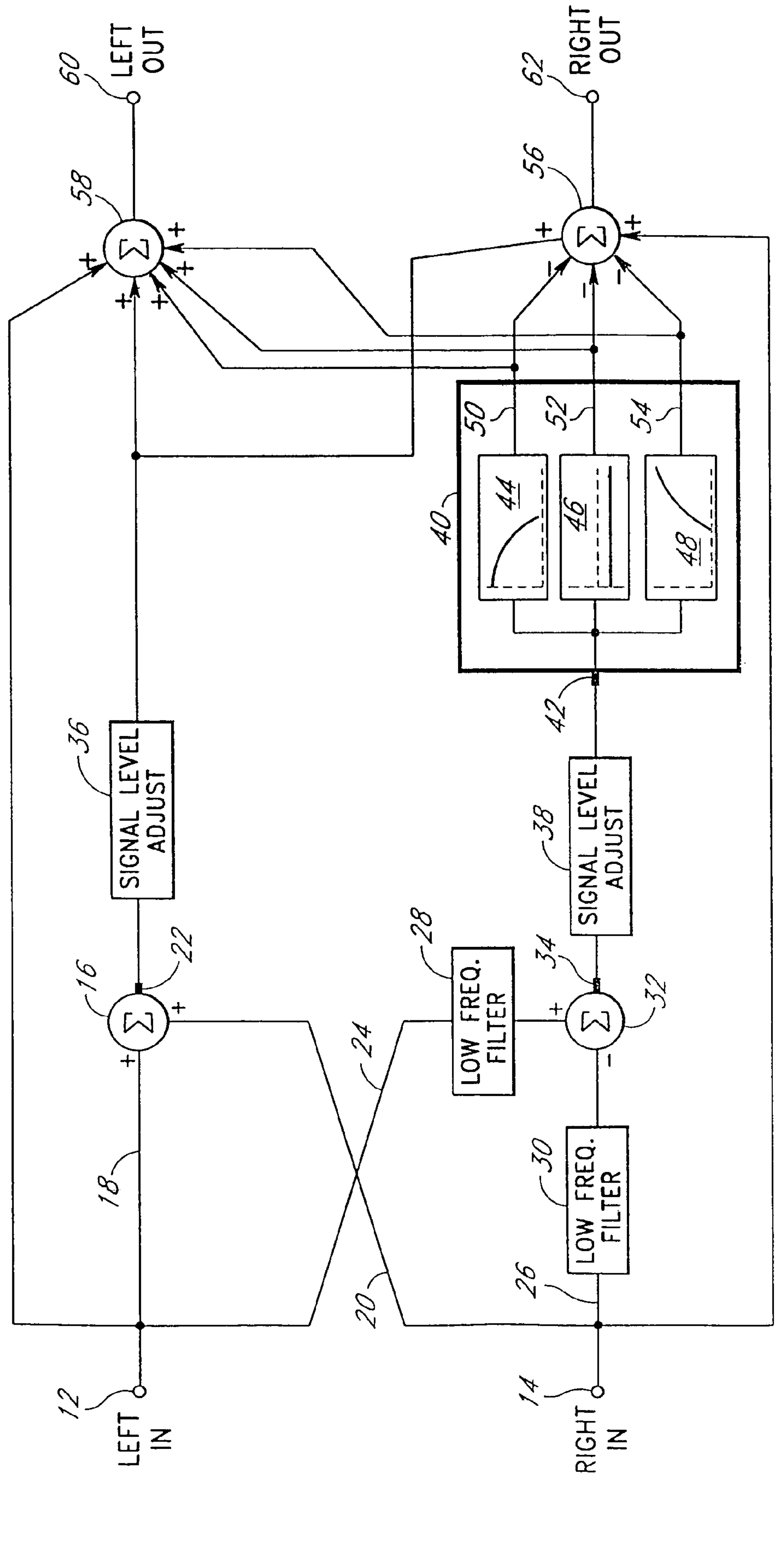
FIG. 1 is a schematic block diagram of a stereo enhancement system for generating a broadened stereo image from a pair of input stereo signals.

Referring initially to FIG. 1, a functional block diagram is shown depicting a preferred embodiment of the present invention. In FIG. 1, a stereo enhancement system 10 inputs a left stereo signal 12 and a right stereo signal 14. The left and right stereo signals 12 and 14 are fed to a first summing device 16, e.g., an electronic adder, along paths 18 and 20, respectively. A sum signal, representing the sum of the left and right stereo signals 12 and 14, is generated by the summing device 16 at its output 22.

The left stereo signal 12 is connected along a path 24 to an audio filter 28, while the right stereo signal 14 is connected along a path 26 to an audio filter 30. The outputs of the filters 28 and 30 are fed to a second summing device 32. The summing device 32 generates a difference signal at an output 34 which represents the difference of the filtered left and right input signals. The filters 28 and 30 are pre-conditioning high-pass filters which are designed to reduce the bass components present in the difference signal. A reduction in difference-signal bass components is performed in accordance with a preferred embodiment for reasons set forth below.

The summing device 16 and the summing device 32 form a summing network having output signals individually fed to separate level-adjusting devices 36 and 38. The devices 36 and 38 are ideally potentiometers or similar variable-impedance devices. Adjustment of the devices 36 and 38 is typically performed manually by a user to control the base level of sum and difference signal present in the output signals. This allows a user to tailor the level and aspect of stereo enhancement according to the type of sound reproduced, and depending on the user's personal preferences. An increase in the level of the sum signal emphasizes the audio signals appearing at a center stage positioned between a pair of speakers. Conversely, an increase in the level of difference signal emphasizes the ambient sound information creating the perception of a wider sound image. In some audio arrangements where the parameters of music type and system configuration are known, or where manual adjustment is not practical, the adjustment devices 36 and 38 may be eliminated and the sum and difference-signal levels fixed at a predetermined value.

The output of the device 38 is fed into an equalizer 40 at an input 42. The equalizer 40 spectrally shapes the difference signal appearing at input 42 by separately applying a low-pass audio filter 44, a high-pass audio filter 48, and an attenuation circuit 46 to the difference signal as shown. Output signals from the filters 44, 48, and the circuit 46 exit the equalizer 40 along paths 50, 54, and 52, respectively.

The modified difference signals transferred along paths 50, 52, and 54 make up the components of a processed difference signal, $(L-R)_p$. These components are fed into a summing network comprising a summing device 56 and a summing device 58. The summing device 56 also receives the sum signal output from the device 36, as well as the original left stereo signal 12. All five of these signals are added within the summing device 58 to produce an enhanced left output signal 60.

Similarly, the modified difference signals from the equalizer 40, the sum signal, and the original right stereo signal 14 are combined within the summing device 56 to produce an enhanced right output signal 62. The components of the difference signal originating along paths 50, 52, and 54 are inverted by the summing device 56 to produce a difference signal for the right speaker, (R−L)p, which is 180 degrees out-of-phase from that of the left speaker.

The overall spectral shaping, i.e., normalization, of the difference signal occurs as the summing devices 56 and 58 combine the filtered and attenuated components of the difference signal to create the left and right output signals 60 and 62. Accordingly, the enhanced left and right output signals 60 and 62 produce a much improved audio effect because ambient sounds are selectively emphasized to fully encompass a listener within a reproduced sound stage. The left and right output signals 60 and 62 are represented by the following mathematical formulas:

$$L_{out}=L_{in}+K_1(L+R)+K_2(L-R)_p \tag{1}$$

$$R_{out}=R_{in}+K_1(L+R)-K_2(L-R)_p \tag{2}$$

It should be noted that input signals $L_{in}$ and $R_{in}$ in the equations above are typically stereo source signals, but may also be synthetically generated from a monophonic source. One such method of stereo synthesis which may be used with the present invention is disclosed in U.S. Pat. No. 4,841,572, also issued to Arnold Klayman and incorporated herein by reference. Moreover, as discussed in U.S. Pat. No. 4,748,669, the enhanced left and right output signals represented above may be magnetically or electronically stored on various recording media, such as vinyl records, compact discs, digital or analog audio tape, or computer data storage media. Enhanced left and right output signals which have been stored may then be reproduced by a conventional stereo reproduction system to achieve the same level of stereo image enhancement.

The signal $(L-R)_p$ in the equations above represents the processed difference signal which has been spectrally shaped according to the present invention. In accordance with a preferred embodiment, modification of the difference signal is represented by the frequency response depicted in FIG. 2, which is labeled the enhancement perspective, or normalization, curve 70.

The perspective curve 70 is displayed as a function of gain, measured in decibels, against audible frequencies displayed in log format. According to a preferred embodiment, the perspective curve 70 has a peak gain of approximately 10 dB at a point A located at approximately 125 Hz. The gain of the perspective curve 70 decreases above and below 125 Hz at a rate of approximately 6 dB per octave. The perspective curve 70 applies a minimum gain of −2 dB to the difference signal at a point B of approximately 2.1 Khz. The gain increases above 2.1 Khz at a rate of 6 dB per octave up to a point C at approximately 7 Khz, and then continues to increase up to approximately 20 Khz, i.e., approximately the highest frequency audible to the human ear. Although the overall equalization of the perspective curve 70 is accomplished using high-pass and low-pass filters, it is possible to also use a band-rejection filter, having a minimum gain at point B, in conjunction with a high-pass filter to obtain a similar perspective curve.

In a preferred embodiment, the gain separation between points A and B of the perspective curve 70 is ideally designed to be 12 dB, and the gain separation between points B and C should be approximately 6 dB. These figures are design constraints and the actual figures will likely vary from circuit to circuit depending on the actual value of components used. If the signal level devices 36 and 38 are fixed, then the perspective curve 70 will remain constant. However, adjustment of the device 38 will slightly vary the gain separation between points A and B, and points B and C. If the maximum gain separation is significantly less than 12 dB, the resulting effect is an increase in the mid-range amplification which can create an uncomfortable listening experience. Conversely, a gain separation much larger than 12 dB tends to reduce a listener's perception of mid-range definition.

Implementation of the perspective curve by a digital signal processor will, in most cases, more accurately reflect the design constraints discussed above. For an analog implementation, it is acceptable if the frequencies corresponding to points A, B, and C, and the constraints on gain separation, vary by plus or minus 20 percent. Such a deviation from the ideal specifications will still produce the desired stereo enhancement effect, although with less than optimum results.

Figure 2:
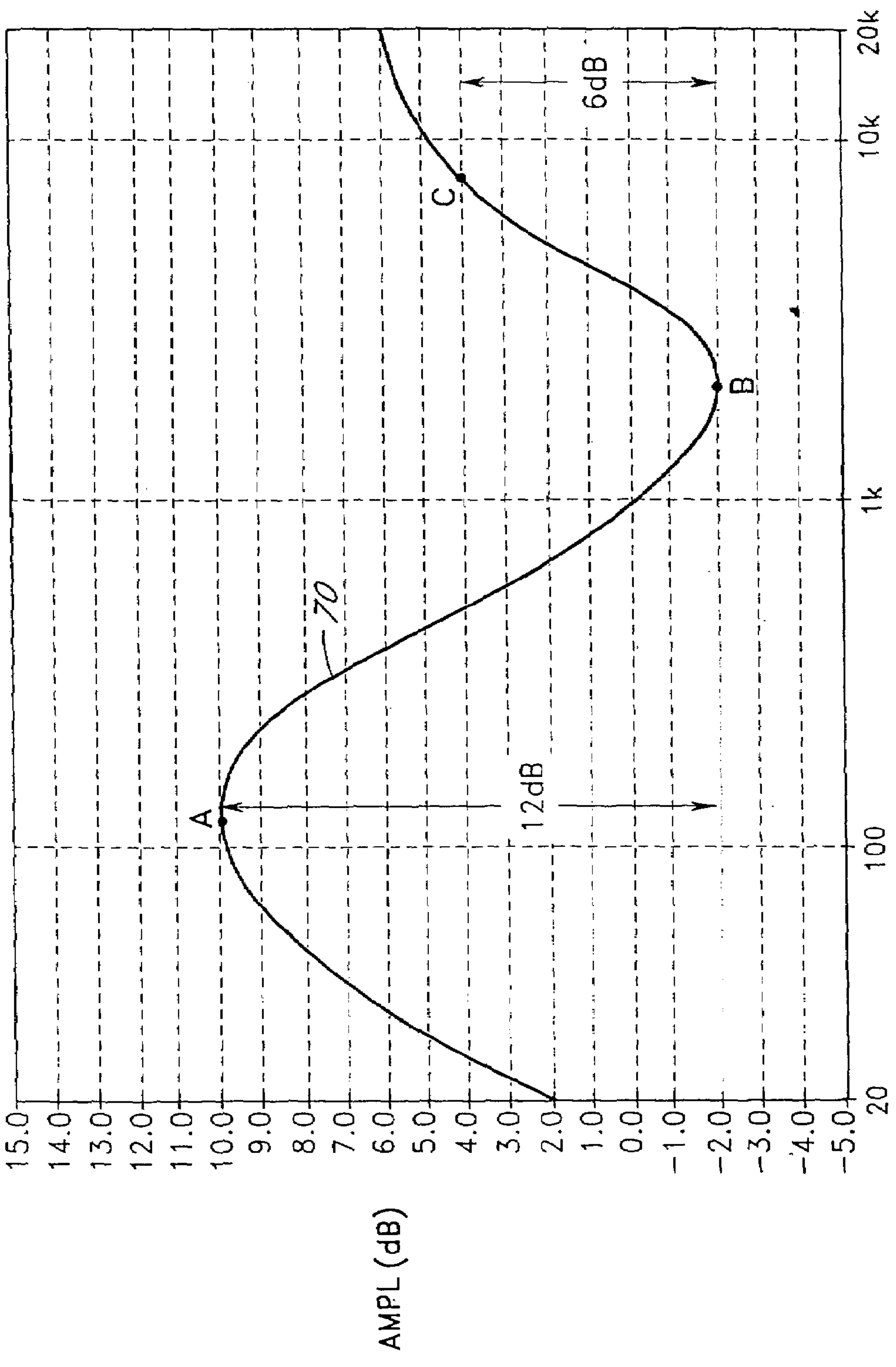
FIG. 2 is a graphical display of the frequency response of a perspective enhancement curve applied to the difference signal stereo component.

As can be seen in FIG. 2, difference signal frequencies below 125 Hz receive a decreased amount of boost, if any, through the application of the perspective curve 70. This decrease is intended to avoid over-amplification of very low, i.e., bass, frequencies. With many audio reproduction systems, amplifying an audio difference signal in this low-frequency range can create an unpleasurable and unrealistic sound image having too much bass response. These audio reproduction systems include near-field or low-power audio systems, such as multimedia computer systems, as well as home stereo systems.

The stereo enhancement provided by the present invention is uniquely adapted to take advantage of high-quality stereo recordings. Specifically, unlike previous analog tape or vinyl album recordings, today's digitally stored sound recordings contain difference signal, i.e. stereo, information throughout a broader frequency spectrum, including the bass frequencies. Excessive amplification of the difference signal within these frequencies is therefore not required to obtain adequate bass response.

Currently, there is a rapidly-increasing number of interactive multimedia computer systems owned by the ordinary consumer and those in business alike. These systems often contain integrated audio processors or peripheral sound devices, such as sound cards, to enhance their audio-visual effect. Sound produced by multimedia computers, and other near-field audio systems such as portable stereo systems, can be of relatively low quality because of power limitations, speaker-placement limitations, and listening-position limitations imposed by such systems. Although these limitations make near-field systems viable candidates for sound image enhancement, they also impose unique problems which must be overcome by any stereo enhancement system.

Specifically, a large draw of power in these systems may cause amplifier "clipping" during periods of high boost, or it may damage components of the audio circuit including the speakers. Limiting the bass response of the difference signal also helps avoid these problems in most near-field audio enhancement applications.

Because the bass frequencies of the difference signal are not highly boosted in accordance with a preferred embodiment, audio information in the very low frequencies will also be provided by the sum signal, L+R, which is of course monophonic. In near-field systems this is of no concern because bass information applied to a pair of speakers as a sum signal will create an acoustic image in between the two speakers—precisely where the listener is expected to be. Nevertheless, the left and right signals do supply bass information and provide bass directional cues in the near-field through their corresponding amplitude levels.

Even if an audio system is not a near-field system, i.e., it has widely separated speakers and a large listening area, the perspective curve depicted in FIG. 2 will still provide adequate low-frequency image enhancement. Specifically, bass frequencies have very large wavelengths which require a large listening area to effectively perceive a broadened bass sound image. For example, a frequency of 30 Hz has a wavelength of approximately 39 feet. A listener attempting to perceive direction in such bass frequencies would require a listening area of the same order. Consequently, stereo enhancement accomplished with the perspective curve of FIG. 2 is also suitable for home stereo and other far-field applications.

In the absence of sum-signal equalization, stereo enhancement can be achieved, in accordance with the acoustic principles discussed herein, with a minimum of components given the proper circuit design. The present invention, therefore, can be readily and inexpensively implemented in numerous applications including those having limited available space for housing a stereo enhancement circuit.

Figure 3:
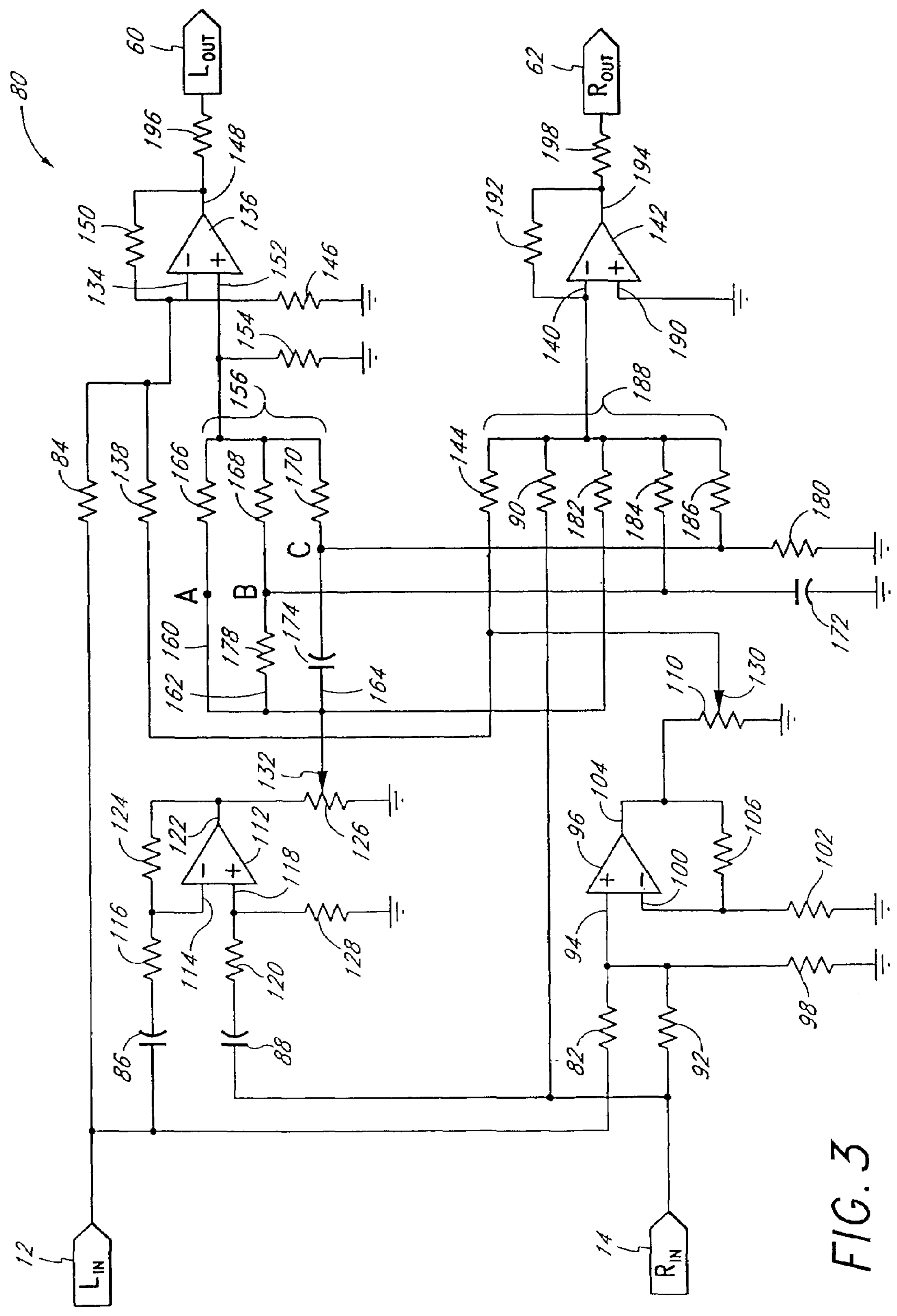
FIG. 3 is a schematic diagram of a preferred embodiment of a stereo enhancement system for generating a broadened stereo image from a pair of input stereo signals.

FIG. 3 depicts a circuit for creating a broadened stereo sound image in accordance with a preferred embodiment of the present invention. The stereo enhancement circuit 80 corresponds to the system 10 shown in FIG. 1. In FIG. 3, the left input signal 12 is fed to a resistor 82, a resistor 84, and a capacitor 86. The right input signal 14 is fed to a capacitor 88 and resistors 90 and 92.

The resistor 82 is in turn connected to an inverting terminal 94 of an amplifier 96. The same inverting terminal 94 is also connected to the resistor 92 and a resistor 98. The amplifier 96 is configured as a summing amplifier with the positive terminal 100 connected to ground via a resistor 102. An output 104 of the amplifier 96 is connected to the positive input 100 via a feedback resistor 106. A sum signal (L+R), representing the sum of the left and right input signals, is generated at the output 104 and fed to one end of a variable resistor 110 which is grounded at an opposite end. For proper summing of the left and right input signals by the amplifier 96, the values of resistors 82, 92, 98, and 106 in a preferred embodiment are 33.2 kohms while resistor 98 is preferably 16.5 kohms.

A second amplifier 112 is configured as a "difference" amplifier. The amplifier 112 has an inverting terminal 114 connected to a resistor 116 which is in turn connected in series to the capacitor 86. Similarly, a positive terminal 118 of the amplifier 112 receives the right input signal through the series connection of a resistor 120 and the capacitor 88. The terminal 118 is also connected to ground via a resistor 128. An output terminal 122 of the amplifier 112 is connected to the inverting terminal through a feedback resistor 124. The output 122 is also connected to a variable resistor 126 which is in turn connected to ground. Although the amplifier 112 is configured as a "difference" amplifier, its function may be characterized as the summing of the right input signal with the negative left input signal. Accordingly, the amplifiers 96 and 112 form a summing network for generating a sum signal and a difference signal, respectively.

The two series connected RC networks comprising elements 86/116 and 88/118, respectively, operate as high-pass filters which attenuate the very low, or bass, frequencies of the left and right input signals. To obtain the proper frequency response for the perspective curve 70 of FIG. 2, the cutoff frequency, $w_c$, or −3 dB frequency, for the high-pass filters should be approximately 100 Hz. Accordingly, in a preferred embodiment, the capacitors 86 and 88 will have a capacitance of 0.1 micro-farad and the resistors 116, 120 will have an impedance of approximately 33.2 kohms. Then, by choosing values for the feedback resistor 124 and the attenuating resistor 128 such that:

$$\frac{R_{120}}{R_{128}} = \frac{R_{116}}{R_{124}} \tag{3}$$

the output 122 will represent the right difference signal, (R−L), amplified by a gain of two. As a result of the high-pass filtering of the inputs, the difference signal at the output 122 will have attenuated low-frequency components below approximately 125 Hz decreasing at a rate of 6 dB per octave. It is possible to filter the low frequency components of the difference signal within the equalizer 40, instead of using the filters 28 and 30 (shown in FIG. 1), to separately filter the left and right input signals. However, because the filtering capacitors at low frequencies must be fairly large, it is preferable to perform this filtering at the input stage to avoid loading of the preceding circuit.

It should be noted that the difference signal refers to an audio signal containing information which is present in one input channel, i.e., either left or right, but which is not present in the other channel. The particular phase of the difference signal is relevant when determining the final makeup of the output signal. Thus, in a general sense, the difference signal signifies both L−R and R−L, which are merely 180 degrees out-of-phase. Accordingly, as can be appreciated by one of ordinary skill in the art, the amplifier 112 could be configured so that the difference signal for the left output (L−R) appears at the output 122, instead of (R−L), as long as the difference signals at the left and right outputs are out-of-phase with respect to each other.

The variable resistors 110 and 126, which may be simple potentiometers, are adjusted by placement of wiper contacts 130 and 132, respectively. The level of difference signal present in the enhanced output signals may be controlled by manual, remote, or automatic adjustment of the wiper contact 132. Similarly, the level of sum signal present in the enhanced output signals is determined in part by the position of the wiper contact 130.

The sum signal present at the wiper contact 130 is fed to an inverting input 134 of a third amplifier 136 through a series-connected resistor 138. The same sum signal at the wiper contact 130 is also fed to an inverting input 140 of a fourth amplifier 142 through a separate series-connected resistor 144. The amplifier 136 is configured as a difference amplifier with the inverting terminal 134 connected to ground through a resistor 146. An output 148 of the amplifier 136 is also connected to the inverting terminal 134 via a feedback resistor 150.

A positive terminal 152 of the amplifier 136 provides a common node which is connected to a group of summing resistors 156 and is also connected to ground via a resistor 154. The level-adjusted difference signal from the wiper contact 132 is transferred to the group of summing resistors 156 through paths 160, 162, and 164. This results in three separately-conditioned difference signals appearing at points A, B, and C, respectively. These conditioned difference signals are then connected to the positive terminal 152 via resistors 166, 168, and 170 as shown.

At point A along the path 160, the level-adjusted difference signal from wiper contact 132 is transferred to the resistor 166 without any frequency-response modification. Accordingly, the signal at point A is merely attenuated by the voltage division between the resistor 166 and the resistor 154. Ideally, the level of attenuation at node A will be −12 dB relative to a 0 dB reference appearing at node B. This level of attenuation is implemented by the resistor 166 having an impedance of 100 kohms and the resistor 154 having an impedance of 27.4 kohms. The signal at node B represents a filtered version of the level-adjusted difference signal appearing across a capacitor 172 which is connected to ground. The RC network of the capacitor 172 and a resistor 178 operate as a low-pass filter with a cutoff frequency determined by the time constant of the network. In accordance with a preferred embodiment, the cutoff frequency, or −3 dB frequency, of this low-pass filter is approximately 200 Hz. Accordingly, the resistor 178 is preferably 1.5 kohms and the capacitor 172 is 0.47 micro-farads, and the drive resistor 168 is 20 kohms.

At node C, a high-pass filtered difference signal is fed through the drive resistor 170 to the inverting terminal 152 of the amplifier 136. The high-pass filter is designed with a cutoff frequency of approximately 7 Khz and a relative gain to node B of −6 dB. Specifically, the capacitor 174 connected between node C and the wiper contact 132 has a value of 4700 picofarads, and the resistor 180 connected between node C and ground has a value of 3.74 kohms.

The modified difference signals present at circuit locations A, B, and C are also fed into the inverting terminal 140 of the amplifier 142 through resistors 182, 184 and 186, respectively. The three modified difference signals, the sum signal and the right input signal are provided to a group of summing resistors 188 which are in turn connected to the amplifier 142. The amplifier 142 is configured as an inverting amplifier having a positive terminal 190 connected to ground and a feedback resistor 192 connected between the terminal 140 and an output 194. To achieve proper summing of the signals by the inverting amplifier 142, the resistor 182 has an impedance of 100 kohms, the resistor 184 has an impedance of 20 kohms, and the resistor 186 has an impedance of 44.2 kohms. The exact values of the resistors and capacitors in the stereo enhancement system may be altered as long as the proper ratios are maintained to achieve the correct level of enhancement. Other factors which may affect the value of the passive components are the power requirements of the enhancement system 80 and the characteristics of the amplifiers 104, 122, 136, and 142.

In operation, the modified difference signals are recombined to generate output signals comprised of a processed difference signal. Specifically, difference signal components found at points A, B, and C are recombined at the terminal 152 of the difference amplifier 136, and at the terminal 140 of the amplifier 142, to form a processed difference signal $(L-R)_p$. The signal $(L-R)_p$ represents the difference signal which has been equalized through application of the perspective curve of FIG. 2. Ideally then, the perspective curve is characterized by a gain of 4 dB at 7 Khz, a gain of 10 dB at 125 Hz, and a gain of −2 dB at 2100 Hz.

The amplifiers 136 and 142 operate as mixing amplifiers which combine the processed difference signal with the sum signal and either the left or right input signal. The signal at the output 148 of the amplifier 136 is fed through a drive resistor 196 to produce the enhanced left output signal 60. Similarly, the signal at the output 194 of the amplifier 142 travels through a drive resistor 198 to produce the enhanced right output signal 62. The drive resistors will typically have an impedance on the order of 200 ohms. The enhanced left and right output signals can be expressed by the mathematical equations (1) and (2) recited above. The value of $K_1$ in equations (1) and (2) is controlled by the position of the wiper contact 130 and the value of $K_2$ is controlled by the position of the wiper contact 132.

All of the individual circuit components depicted in FIG. 3 may be implemented digitally through software run on a microprocessor, or through a digital signal processor. Accordingly, an individual amplifier, an equalizer, etc., may be realized by a corresponding portion of software or firmware.

Figure 4:
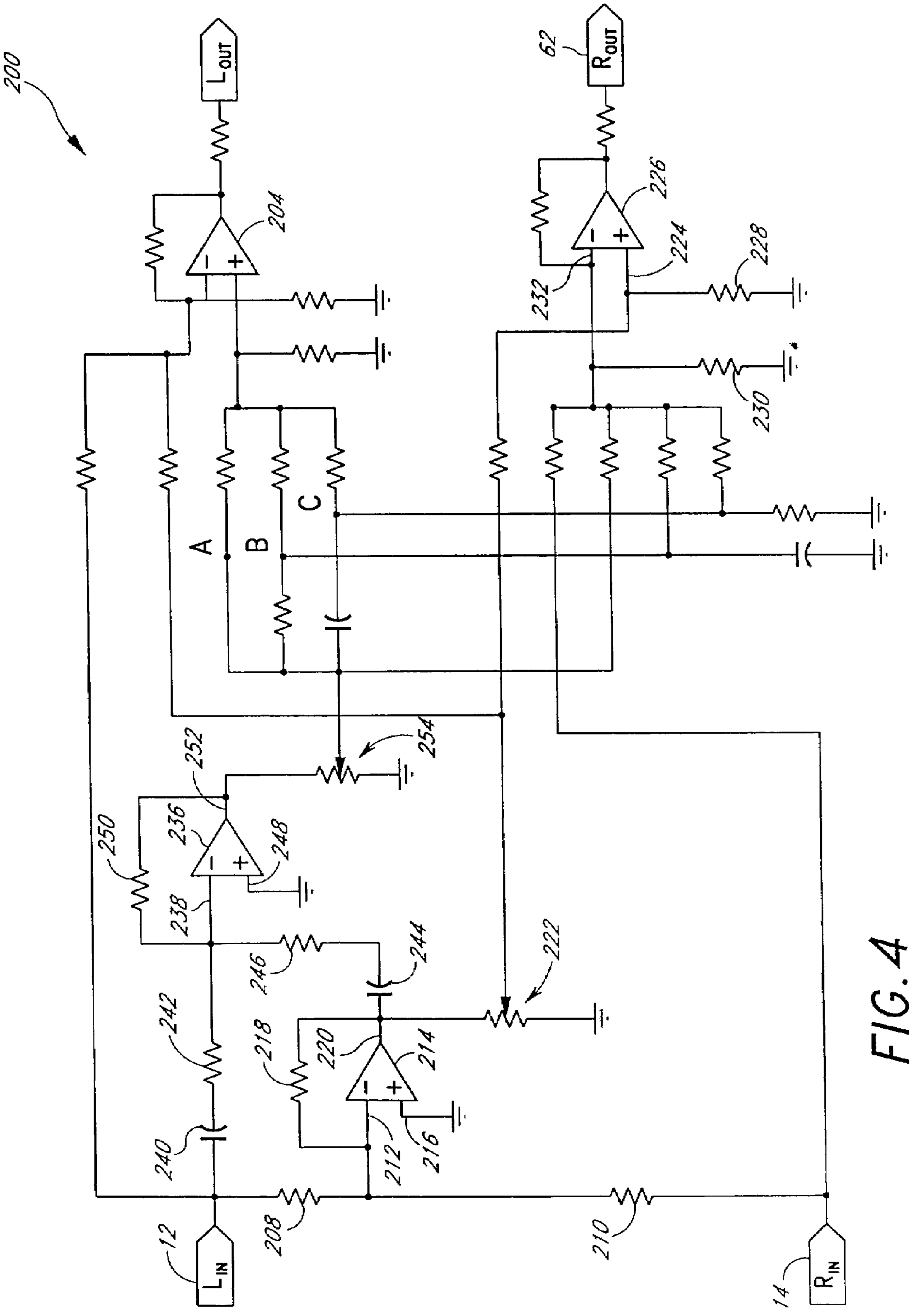
FIG. 4 is a schematic diagram of an alternative embodiment of a stereo enhancement system for generating a broadened stereo image from a pair of input stereo signals.

An alternative embodiment of the stereo enhancement circuit 80 is depicted in FIG. 4. The circuit of FIG. 4 is similar to that of FIG. 3 and represents another method for applying the perspective curve 70 (shown in FIG. 2) to a pair of stereo audio signals. The stereo enhancement system 200 utilizes an alternative summing network configuration for generating a sum and difference signal.

In the alternative embodiment 200, the left and right input signals 12 and 14 are still ultimately fed into the negative input of mixing amplifiers 204 and 226. To generate the sum and difference signals, however, the left and right signals 12 and 14 are first fed through resistors 208 and 210, respectively, and into the inverting terminal 212 of a first amplifier 214. The amplifier 214 is configured as an inverting amplifier with a grounded input 216 and a feedback resistor 218. The sum signal, or in this case the inverted sum signal −(L+R), is generated at the output 220. The sum signal component is then fed to the remaining circuitry after being level-adjusted by the variable resistor 222. Because the sum signal in the alternative embodiment is now inverted, it is fed to a non-inverting input 224 of the amplifier 226. Accordingly, the amplifier 226 now requires a current-balancing resistor 228 placed between the non-inverting input 224 and ground potential. Similarly, a current-balancing resistor 230 is placed between an inverting input 232 and ground potential. These slight modifications to the amplifier 226 in the alternative embodiment are necessary to achieve correct summing to generate the right output signal 62.

To generate a difference signal, an inverting summing amplifier 236 receives the left input signal and the sum signal at an inverting input 238. More specifically, the left input signal 12 is passed through a capacitor 240 and a resistor 242 before arriving at the input 238. Similarly, the inverted sum signal at the output 220 is passed through a capacitor 244 and a resistor 246. The RC networks created by components 240/242 and components 244/246 provide the bass frequency filtering of the audio signal as described in conjunction with a preferred embodiment.

The amplifier 236 has a grounded non-inverting input 248 and a feedback resistor 250. A difference signal, R−L, is generated at an output 252 with impedance values of 100 kohm for the resistors 208, 210, 218, and 242, impedance values of 200 kohm for the resistors 246 and 250, a capacitance of 0.15 micro-farads for the capacitor 244, and a capacitance of 0.33 micro-farads for the capacitor 240. The difference signal is then adjusted by the variable resistor 254 and fed into the remaining circuitry. Except as described above, the remaining circuitry of FIG. 4 is the same as that of a preferred embodiment disclosed in FIG. 3.

The entire stereo enhancement system 80 of FIG. 3 uses a minimum of components to implement acoustic principles and generate award-winning stereo sound. The system 80 may be constructed with only four active components, typically operational amplifiers corresponding to amplifiers 104, 112, 136, and 142. These amplifiers are readily available as a quad package on a single semiconductor chip. Additional components needed to complete the stereo enhancement system 80 include only 29 resistors and 4 capacitors. The system 200 can also be manufactured with a quad amplifier, 4 capacitors, and only 29 resistors, including the potentiometers and output resistors. Because of its unique design, the enhancement systems 80 and 200 can be produced at minimal cost utilizing minimal component space and still provide unbelievable broadening of an existing stereo image. In fact, the entire system 80 can be formed as a single semiconductor substrate, or integrated circuit.

Apart from the embodiments depicted in FIGS. 3 and 4, there are conceivably additional ways to interconnect the same components obtain perspective enhancement of stereo signals. For example, a pair of amplifiers configured as difference amplifiers may receive the left and right signals, respectively, and may also each receive the sum signal. In this manner, the amplifiers would generate a left difference signal, L–R, and a right difference signal, R–L, respectively.

The perspective modification of the difference signal resulting from the enhancement systems 80 and 200 has been carefully engineered to achieve optimum results for a wide variety of applications and inputted audio signals. Adjustments by a user currently include only the level of sum and difference signals applied to the conditioning circuitry. However, it is conceivable that potentiometers could be used in place of resistors 178 and 180 to allow for adaptive equalization of the difference signal.

Through the foregoing description and accompanying drawings, the present invention has been shown to have important advantages over current stereo enhancement systems. While the above detailed description has shown, described, and pointed out the fundamental novel features of the invention, it will be understood that various omissions and substitutions and changes in the form and details of the device illustrated may be made by those skilled in the art, without departing from the spirit of the invention. Therefore, the invention should be limited in its scope only by the following claims.

What is claimed is:

1. An apparatus for enhancing sound, the apparatus comprising:

a first input and a second input of original audio data, wherein the audio data comprises a full range of frequencies within an original audio band without passing through a subsonic filter;

a difference circuit configured to identify difference information in the first and second inputs, wherein the difference information has bass components filtered therefrom;

an equalizer configured to spectrally shape the difference information, wherein the difference information is spectrally shaped by the equalizer by applying a perspective curve characterized by a maximum gain within a first frequency range of 100 to 150 Hz and the curve characterized by a minimum gain within a second frequency range of 1680 to 2520 Hz, wherein the curve decreases at a rate of approximately 6 decibels per octave below the first frequency range and above the first frequency range towards the second frequency range, the curve further increasing at a rate of approximately 6 decibels per octave above the second frequency range;

a summing circuit configured to combine the spectrally shaped difference information with at least a portion of the original audio data in the first input to generate a first output comprising the spectrally shaped difference information and the original audio data in the first input including at least a portion of the bass components that were filtered from the spectrally shaped difference information, and the summing circuit further configured to combine the spectrally shaped difference information with at least a portion of the original audio data in the second input to generate a second output comprising the spectrally shaped difference information and the original data in the second input including at least a portion of the bass components filtered from the spectrally shaped difference information.

2. The apparatus of claim 1 wherein the maximum gain and the minimum gain are separated by approximately 12 decibels.

3. The apparatus of claim 1 wherein the perspective curve is adjustable to raise or lower the maximum and minimum-gain frequencies with the maximum-gain range and the minimum-gain range.

4. The apparatus of claim 1 further comprising a level adjust circuit in communication with the difference circuit, the level adjust circuit configured to adjust the level of the difference information.

5. The apparatus of claim 1 wherein the difference circuit, the equalizer, and the summing circuit are implemented in a digital signal processor.

6. The apparatus of claim 1 further comprising an attenuator that attenuates the difference information by a fixed amount substantially across an audible frequency spectrum.

7. A method for enhancing sound, the method comprising:

receiving at least a first input and a second input of original audio data, wherein the original audio data comprises a range of frequencies within an original audio band without passing through a subsonic filter;

spectrally shaping difference information in the first and second inputs, wherein the spectrally shaped difference information has at least a portion of a first set of bass components filtered therefrom, wherein spectrally shaping the difference information boosts the amplitudes of a second set of frequencies;

combining the spectrally shaped difference information with at least a portion of the original audio data in the first input to generate a first output that comprises the spectrally shaped difference information and the original audio data including at least a portion of the first set of bass components that were filtered from the spectrally shaped difference information;

combining the spectrally shaped difference information with at least a portion of the original audio data in the second input to generate a second output that comprises the spectrally shaped difference information and the original audio data including at least a portion of the first set of bass components that were filtered from the spectrally shaped difference information;

wherein spectrally shaping the difference information further reduces the amplitudes of a third set of frequencies relative to the amplitudes of the second set of frequencies, the third set of frequencies occurring at higher frequencies than the second set of frequencies; and wherein a maximum reduction of the amplitudes of the third set of frequencies occurs at approximately 2.1 kilohertz.

8. A method for enhancing sound, the method comprising:

receiving at least a first input and a second input of original audio data, wherein the original audio data comprises a range of frequencies within an original audio band without passing through a subsonic filter;

spectrally shaping difference information in the first and second inputs, wherein the difference information has a portion of a first set of bass components filtered therefrom, and wherein spectrally shaping the difference information boosts the amplitudes of a second set of frequencies;

combining the spectrally shaped difference information with at least a portion of the original audio data to generate an output that contains at least a portion of the spectrally shaped difference information and the original audio data including a portion of the first set of bass components that were filtered from the spectrally shaped difference information;

wherein spectrally shaping the difference information further reduces the amplitudes of a third set of frequencies relative to the amplitudes of the second set of frequencies, the third set of frequencies occurring at higher frequencies than the second set of frequencies; and wherein spectrally shaping the difference information further boosts the amplitudes of a fourth set of frequencies relative to the amplitudes of the third set of frequencies, the fourth set of frequencies occurring at higher frequencies than the third set of frequencies.

9. The method of claim 8 wherein a maximum boost of the amplitudes of the fourth set of frequencies occurs above approximately 2.1 kilohertz.

10. A method for enhancing sound, the method comprising:

receiving at least a first input and a second input of original audio data, wherein the original audio data comprises a range of frequencies within an original band without passing through a subsonic filter;

spectrally shaping difference information in the first and second inputs, wherein the difference information has a portion of a first set of bass components filtered therefrom, and wherein spectrally shaping the difference information modifies the amplitudes of a second set of frequencies; and combining the spectrally shaped difference information with at least a portion of the original audio data to generate an output that comprises the spectrally shaped difference information and the original audio data including a portion of the first set of bass components that were filtered from the spectrally shaped difference information;

wherein spectrally shaping the difference information further modifies the amplitudes of a third set of frequencies such that the amplitudes of the fourth set of frequencies are less than the amplitudes of the second set of frequencies, the third set of frequencies occurring at higher frequencies than the second set of frequencies; and wherein spectrally shaping the difference information further modifies the amplitudes of a fourth set of frequencies such that the amplitudes of the fourth set of frequencies are greater than the amplitudes of the third set of frequencies, the fourth set of frequencies occurring at higher frequencies than the third set of frequencies.

11. The audio enhancement system of claim 10 wherein spectrally shaping the difference information is performed by a digital signal processor.

* * * * *

UNITED STATES PATENT AND TRADEMARK OFFICE

CERTIFICATE OF CORRECTION

PATENT NO. : 7,636,443 B2
APPLICATION NO. : 10/614623
DATED : December 22, 2009
INVENTOR(S) : Arnold I. Klayman It is certified that error appears in the above-identified patent and that said Letters Patent is hereby corrected as shown below:

Title page, item (*) Notice: should read as follows: Subject to any disclaimer, the term of this patent is extended or adjusted under 35 U.S.C. 154(b) by 1398 days.

At column 11, line 66-67, Claim 1, change “information,” to --information;--.

At column 14, line 16, Claim 10, change “fourth” to --third--.

Signed and Sealed this

Twenty-fourth Day of August, 2010

David J. Kappos
*Director of the United States Patent and Trademark Office*